United States Patent
Bruce et al.

(10) Patent No.: US 6,621,288 B1
(45) Date of Patent: *Sep. 16, 2003

(54) TIMING MARGIN ALTERATION VIA THE INSULATOR OF A SOI DIE

(75) Inventors: Michael R. Bruce, Austin, TX (US); Rama R. Goruganthu, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 115 days.

This patent is subject to a terminal disclaimer.

(21) Appl. No.: 09/864,665

(22) Filed: May 23, 2001

(51) Int. Cl.[7] .................. G01R 31/26; G01R 31/302; G01R 31/305; H01L 23/58; H01L 27/108

(52) U.S. Cl. ............... 324/765; 324/751; 324/752; 324/767; 324/158.1; 324/501; 257/48; 257/296; 257/350

(58) Field of Search ................. 324/765, 752, 324/501, 158.1, 767; 250/341.4, 310, 338.1, 342, 306; 257/48, 296, 350, 347

(56) References Cited

U.S. PATENT DOCUMENTS

| 4,698,587 | A | * | 10/1987 | Burns et al. ............... 324/765 |
| 5,430,305 | A | * | 7/1995 | Cole, Jr. et al. ......... 250/559.07 |
| 5,493,236 | A | * | 2/1996 | Ishii et al. .................. 324/752 |
| 5,872,360 | A | * | 2/1999 | Paniccia et al. ......... 250/341.4 |
| 5,920,067 | A | * | 7/1999 | Cresswell et al. .......... 250/306 |
| 6,309,897 | B1 | * | 10/2001 | Livengood .................... 438/14 |
| 6,323,522 | B1 | * | 11/2001 | Hargrove et al. ........... 257/347 |
| 6,366,101 | B1 | * | 4/2002 | Bruce ......................... 324/752 |
| 6,483,326 | B1 | * | 11/2002 | Bruce et al. ................ 324/751 |

* cited by examiner

Primary Examiner—N. Le
Assistant Examiner—Wasseem H. Hamdan

(57) ABSTRACT

Analysis of a semiconductor die having silicon-on-insulator (SOI) structure is enhanced by operating a die and detecting a response that is used to analyze selected characteristics of the die. According to an example embodiment of the present invention, a die having a thinned backside is provided for analysis. The die is operated so that one or more portions of circuitry in the die are near a state-changing transition between a failed mode and a recovered mode. An electron-beam probe is directed to the thinned backside, and the probe electrically couples a capacitance load to underlying circuitry via the insulator of the SOI structure. The capacitance load alters the timing margin of a portion of the circuitry and, thereby, causes the circuitry to undergo a state-changing transition. A response from the circuitry related to the transition is detected and used to analyze the die. In this manner, portions of the die being affected by altered timing margins can be detected.

22 Claims, 2 Drawing Sheets

TIMING MARGIN ALTERATION VIA THE INSULATOR OF A SOI DIE

RELATED PATENT DOCUMENTS

The Patent Document is related to U.S. patent application Ser. No. 09/864,708, entitled "Logic State Mapping in a SOI Die," and to U.S. patent application Ser. No. 09/864,688, now U.S. Pat. No. 6,414,335 B1, Patented on Jul. 2, 2002, entitled "Selective State Change Analysis of a SOI Die," both filed concurrently herewith.

FIELD OF THE INVENTION

The present invention relates generally to semiconductor devices and their fabrication and, more particularly, to testing and analysis of semiconductor dies involving the alteration of the timing margin of the die.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages. As clock frequencies increase, problems associated with the proper timing of various semiconductor die operations increase.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As manufacturing processes for semiconductor devices and integrated circuits increase in difficulty, methods for testing and debugging these devices become increasingly important. Not only is it important to ensure that individual dies are functional, it is also important to ensure that batches of dies perform consistently. In addition, the ability to detect a defective manufacturing process early is helpful for reducing the number of defective devices manufactured.

Traditionally, integrated circuits have been tested using methods including directly accessing circuitry or devices within the integrated circuit. Directly accessing the circuitry is difficult for several reasons. For instance, in flip chip type dies, transistors and other circuitry are located in a very thin epitaxially grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the die.

One particular type of semiconductor device structure that presents unique challenges to back side circuit analysis is silicon-on-insulator (SOI) structure. SOI involves forming an insulator, such as an oxide, over bulk silicon in the back side of a semiconductor device. A thin layer of silicon is formed on top of the insulator, and circuitry is formed over the insulator. The resulting SOI structure exhibits benefits including reduced switch capacitance, which leads to faster operation. Direct access to circuitry for analysis of SOI structure, however, involves milling through the oxide. The milling process can damage circuitry or other structure in the device. Such damage can alter the characteristics of the device and render the analysis inaccurate. In addition, the milling process can be time-consuming, difficult to control, and thus expensive.

Various characteristics of integrated circuit dies affect their reliability, speed and cost. One type of characteristics that are important for many reasons is the timing characteristics of a die. When a die is operated, the timing, of the operation of various portions of the circuitry is selected for the performance of selected operations. Many circuits and the functions that are performed using the circuits can withstand slight variations in timing. However, if the timing is different from what the die is designed to operate under, the operation of the die can be greatly affected. If the die is defective or if there is a design defect, even a slight delay or advance in a timing cycle can cause the die to malfunction in the defective region. These defects narrow the timing operation window of the die and effectively can cause die malfunctions at a higher rate than otherwise would occur. Therefore, identifying the defects and analyzing the die therefrom would be beneficial for addressing the challenges presented by potential defects.

The difficulty, cost, and destructive aspects of existing methods for testing integrated circuits present challenges to the growth and improvement of semiconductor technologies involving SOI structure.

SUMMARY OF THE INVENTION

The present invention is directed to a method and system for analyzing a semiconductor die having silicon-on-insulator (SOI) structure in a manner that addresses the above-mentioned challenges. The present invention is exemplified in a number of implementations and applications, some of which are summarized below.

According to an example embodiment of the present invention, a semiconductor die having SOI structure and circuitry in a circuit side opposite a back side is analyzed. A portion of substrate is removed from a back side of the semiconductor die, and the die is operated at a near a state-changing transition between a failed mode and a recovered mode. While the die is being operated, an electron-beam probe is directed at the thinned back side of the die to electrically couple a capacitance load to underlying circuitry via the insulator of the SOI structure. The capacitance load alters the timing margin of a portion of the circuitry, and the altered timing margin causes the die to undergo a state-changing transition. A response related to the transition is detected and is used to analyze the die. In a more particular example embodiment of the present invention, the detected response is used to identify a portion of the circuitry that exhibits a failure rate in response to the altered timing margin that is greater than the failure rate of other portions of circuitry in the die.

According to another example embodiment of the present invention, a system is adapted for analyzing a semiconductor die having silicon-on-insulator (SOI) structure and circuitry in a circuit side opposite a back side. The system includes a power supply adapted to operate the die near a state-changing transition between a failed mode and a recovered mode. A probe is adapted to probe the thinned back side of the die to electrically couple a capacitance load to underlying circuitry via the insulator of the SOI structure.

The capacitance load alters the timing margin of the circuitry and thereby causes the circuitry to undergo a state-changing transition. A detector is adapted to detect a response from the circuitry, wherein the response is indicative of the region of the circuitry undergoing the state-changing transition, and to analyze the die therefrom.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
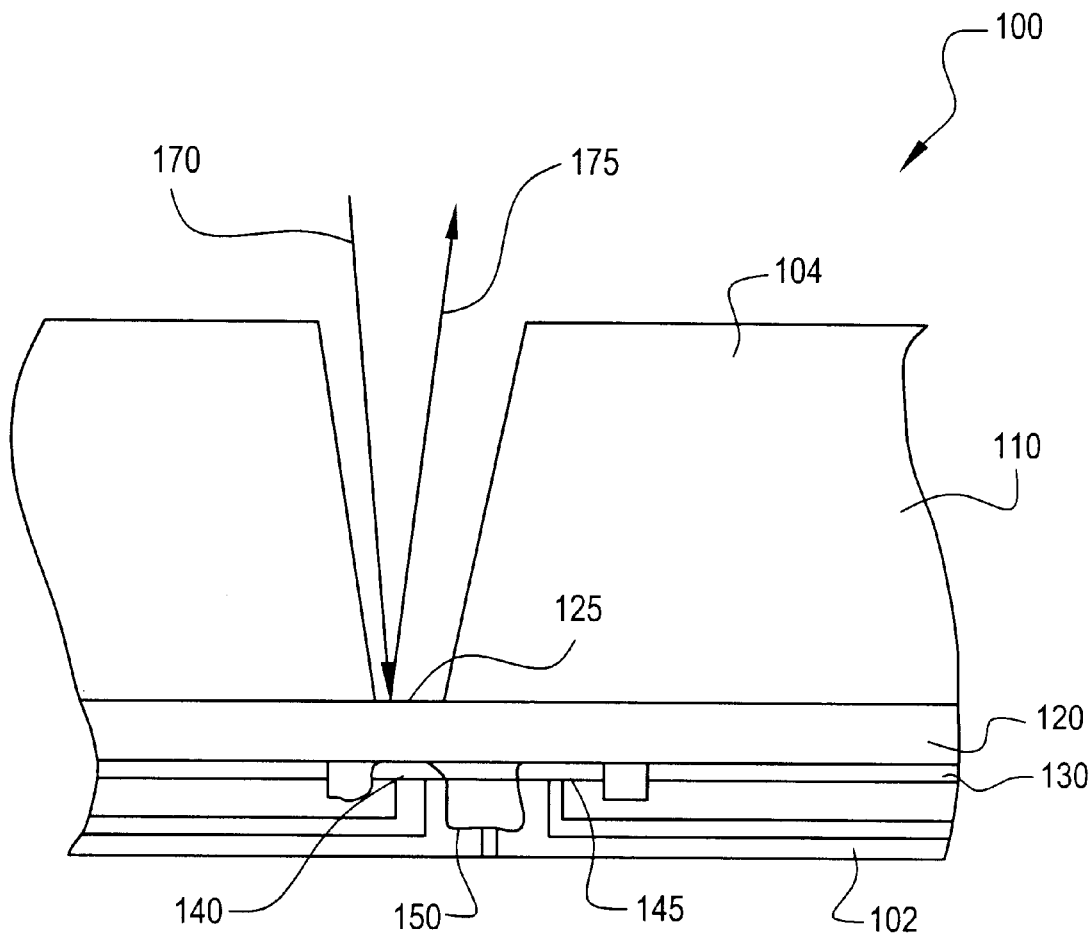
FIG. 1 is a semiconductor die having SOI structure and undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for flip-chip and other type devices having silicon-on-insulator (SOI) structure and requiring or benefiting from probing involving timing analysis. While the present invention is not necessarily limited to such devices, various aspects of the invention may be appreciated through a discussion of various examples using this context.

According to an example embodiment of the present invention, a semiconductor die having SOI structure and a back side opposite circuitry in a circuit side is analyzed. The back side of the die is thinned, for example, to a point near the insulator portion of the SOI structure, and the die is operated so that circuitry in the die is near a state-changing transition. While the die is being operated, an electron-beam probe is used to capacitively couple a voltage through the insulator portion of the SOI structure and to circuitry underneath the insulator. The voltage alters the timing margin of the circuitry and causes a portion of the circuitry to undergo a state-changing transition. The transition is detected and used to analyze the die, such as by identifying a portion of circuitry that changes in response to an altered timing margin before other portions of circuitry are affected. For example, a portion of the die that undergoes a state changing transition due to the altered timing margin can thereby be identified as a portion being more susceptible to altered timing margins than other portions of circuitry in the die. This may be indicative of a defect in the die manufacture or in the die design. The ability to identify such potential defects enhances the ability to analyze such dies after manufacturing, and also enhances the design of the die prior to implementation.

Various implementations of the present invention use different aspects of timing-margin affected state changes to analyze selected characteristics of the die. For example, a portion of the die may exhibit an advanced or delayed response due to a manufacturing or design defect. In many instances, the advanced or delayed response does not cause the die to immediately fail under conventional testing. However, when the timing margin of the die is changed due to other purposes, the combination of the defect and the timing change causes the die to malfunction before it would otherwise have failed, had there not been a defect. This type of defect has been difficult to identify. However, the present invention makes possible the detection of such defects via the altered timing margin in a variety of applications and implementations. For more information regarding the analysis of timing paths and failure modes, reference may be made to U.S. Pat. No. 4,698,587.

Timing-related malfunctions can occur, for example, when an integrated circuit (IC) is operated at a clock frequency that is too high, or when one or more circuit elements within the IC produces an excessive or unaccounted for signal delay in switching a transistor, or in propagating a signal along a path. Operational failures can also occur when the IC is powered by a power supply voltage or current that is outside a range for which the IC has been designed, or when the IC is operated at a temperature outside a normal operating range for the IC. Operational failures can arise as a result of particular operating conditions for the IC even though the IC operates within specifications under other operating conditions. Thus, an operational failure can result from suboptimal performance of particular circuit elements in the IC that produces timing errors, wherein the errors are more likely to occur in defective portions of the circuitry.

One example of such an operational failure results when an electrical signal arrives at a destination too early or too late, resulting in an incorrect value of an output state of the IC, such as a voltage state of a source/drain region. Circuit elements that can be involved with such failures include, for example, switching transistors or functional circuit blocks that switch between logic states at a rate that is slower than normal, and interconnections in the IC that have a resistance larger than an expected value. In general, anything within an IC that results in or contributes to a particular signal within the IC being advanced or delayed in propagation, compared with the time at which the signal should appear, can result in an operational failure in the IC.

In one particular example embodiment of the present invention, the logic state of a downstream circuit portion electrically coupled to a node (e.g., an input-output pin) is monitored. For example, a hold circuit or data processing technique can be used to couple a state change to a circuit portion downstream of a node by scanning the node with an electron-beam probe. A state change is effected at the downstream circuit portion via the electrical coupling and the location of the change is imaged. An overlay of the circuitry is used with the image to detect a circuit portion that is undergoing the state change.

In another example embodiment of the present invention, a semiconductor die is operated near a transition point between defective and recovery states and the timing margin is altered in a manner such as advancing, delaying or varying the margin. An electron beam probe, is used to scan a portion of the semiconductor die, and a response from the die is detected. The probe can be raster scanned across the die, stepped across the die, pulsed or directed in a spot mode at a selected portion. of the die. The response is detected and used to detect a device or circuit path in the die that is suspected to include a defect. In a more particular example, the die is operated in a loop cycle near the transition point. The probe is used to continually scan the die while the die is cycled. This enables the detection of defects that may not occur on a consistent basis (e.g., the defect may only occur about 30% of the time).

The electron beam probe is particularly useful for detecting the voltage state of the circuit portion of the die underlying the portion of the insulator being scanned. When the electron beam is scanned across the surface, secondary electrons are generated as a function of the voltage state of the circuitry. If the circuit portion is at a positive voltage, the emission of secondary electrons is inhibited, and if the voltage is zero or negative, the emission of secondary electrons is generally unaffected. The portion of the die being scanned is correlated with the detected logic state as indicated by the voltage. In this manner, the logic state of the circuitry can be used to detect whether the circuit portion has undergone a state-changing transition.

In one implementation, the response is compared to a known reference response. Comparing responses may include comparing a timing response between the defective die and a reference die, or between in-range and out-of-range specifications using the same die, wherein a delay or advance in response from a particular circuit path within the die is an indication that the circuit path includes the defect or is defectively designed. The timing discrepancies in the responses are noted and used to identify the defective portion of the die. In one instance, the defective portion is identified using an image of the die. In another instance, a circuit layout of the scanned portion of the die is used to correlate the discrepancies to a defective circuit path in the die, such as by using the coordinates of the defective portion. If desired, the suspect circuit path is then further imaged to specifically locate a defective portion of the circuit path.

In another example embodiment of the present invention, the die is thinned in a manner that exposes some or all of the insulator, and the probe is capacitively coupled to the circuitry via the insulator, using the insulator as a dielectric. Electrical characteristics are obtained from the circuitry via the insulator and used to analyze the die. This is particularly useful for analyzing the die without necessarily removing any of the insulator, and thereby maintains the SOI structure. In addition, once the analysis has been performed, the thinned back side is repaired when the die is to be further tested or otherwise used. This is useful for non-destructively testing the die in implementations benefiting from further use of the die.

FIG. 1 shows a portion of a flip chip die 100 undergoing analysis, according to an example embodiment of the present invention. The die exemplifies one of a variety of dies having SOI structure for which the present invention is applicable. The die is in an inverted position with a circuit side 102 facing down and a back side 104 facing up, such as would be a flip chip die bonded to a package substrate. A portion of bulk silicon 110 in the back side has been removed to expose an insulating layer 120, such as a buried oxide (BOX) layer. A thin layer of silicon 130, in combination with the insulator, forms a SOI structure. Source/drain regions 140 and 145 are located in the thin layer of silicon 130, and a gate 150 is located over the thin layer of silicon. The source, drain and gate make up a SOI transistor.

The substrate removal is accomplished using a conventional method, such as by global thinning, local thinning or a combination thereof. The silicon substrate can be removed, for example, using typically-available substrate removal methods and devices, such as using a focused ion beam (FIB), a laser etching device, or an etch chamber having an etch gas and used in combination with a masking step.

The die is powered, and an electron beam 170 is directed at an exposed portion 125 of the insulator 120 to probe the source/drain region 140. Alternative embodiments involve probing through a partially-removed insulator layer, probing through the bulk silicon 110 and/or by electrically coupling to the source/drain region via interconnects in the die. The exposed portion is formed sufficiently deep to facilitate capacitively coupling between a surface of the exposed portion and a source/drain region.

As the beam is used to probe the die, the die is operated under conditions that cause circuitry in the die to be near a state-changing transition. The electron beam capacitively couples a voltage to the source/drain region via the insulator and alters the timing margin of the source/drain region. The altered timing margin, in turn, causes the source/drain region to transition between a pass and fail state. This state transition affects the emission of beam 175. More specifically, the electron beam produces secondary electrons that are affected by the state of the source/drain region 140. The secondary electrons are detected and analyzed to identify that a state change has occurred. If the source/drain region is at a positive voltage, the emission of secondary electrons is inhibited, and if the voltage is zero or negative, the emission of secondary electrons is generally unaffected. By detecting the emission, the logic state of the circuitry is identified and is used to detect a defect. The detected logic state is then used to identify a circuit path that potentially includes a defect, enhanced by the altered timing margin.

Although FIG. 1 shows a small portion of the insulator 120 having been exposed, various implementations of the present invention are directed toward a die having a larger portion of the insulator removed, and in some instances is applied to dies having the entire insulator layer exposed. In these instances, the probe is scanned over one or more areas of the die and used to induce the altered timing margin. This is particularly useful for identifying the location of a defect from among several potential defective locations. In this manner, defect analysis is shortened in time and thereby can be performed in a more cost-effective and efficient way.

Figure 2:
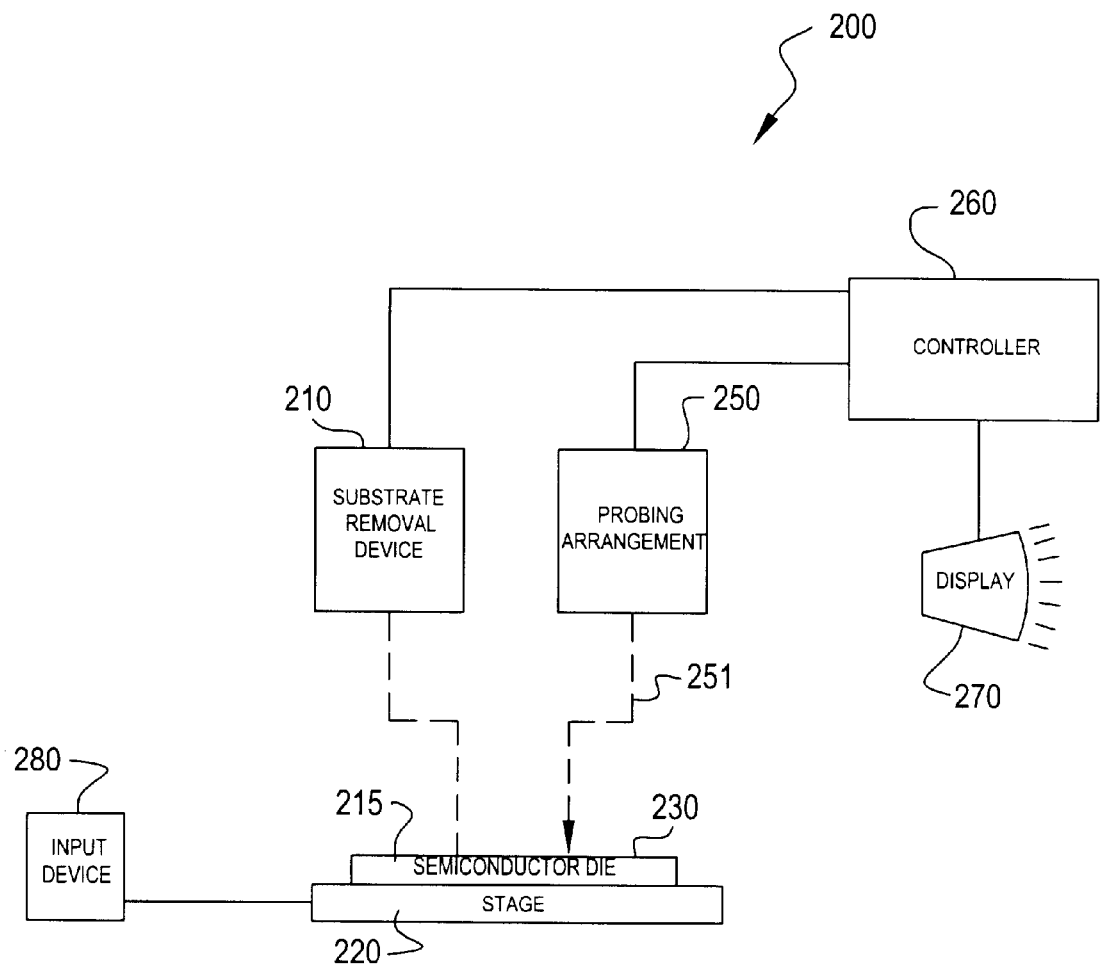
FIG. 2 is a system for analyzing a semiconductor die, according to another example embodiment of the present invention.

According to another example embodiment of the present invention, FIG. 2 shows a system 200 adapted to probe a semiconductor die 215. The system 200 includes a substrate removal device 210 adapted to remove substrate from the back side 230 of the die and to form an exposed region. In one implementation, the substrate removal device includes a FIB, and in another implementation, the substrate removal device includes a laser-etching device. The die is positioned on a stage 220 and electrically coupled via the stage to an input device 280, such as a signal generator, adapted to power the die and operate the die near a state-changing transition.

A probing arrangement 250 is adapted to direct an electron beam 251 at the die and obtain a response therefrom. The probe arrangement and substrate removal devices are shown optionally coupled to a controller 260 that includes a computer arrangement adapted to control the probe and/or the substrate removal device. In one implementation, the computer arrangement is adapted to interpret response characteristics for analyzing the semiconductor die. The computer arrangement is further coupled to a visual display device 270 used to display information obtained via the probe.

In another example embodiment of the present invention, a waveform response is detected from the die and displayed on the visual display device 270. The waveform is analyzed and compared to a known waveform. Any discrepancies are noted and used to identify a circuit path that undergoes a state-changing operation.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having silicon-on-insulator (SOI) structure and circuitry in a circuit side opposite a back side, the method comprising:

providing a die having a thinned backside;

operating circuitry in the die near a state-changing transition between a failed mode and a recovered mode;

directing an electron-beam probe at the thinned back side of the die to electrically couple a capacitance load to underlying circuitry via the insulator of the SOI structure and thereby altering the timing margin of a portion of the circuitry, the altered timing margin causing a portion of the die to undergo a state-changing transition; and, detecting a response from the die, the response being related to the altered timing margin, and analyzing the die therefrom.

2. The method of claim 1, wherein directing an electron-beam probe includes scanning an electron beam across the thinned back side of the die.

3. The method of claim 1, wherein analyzing the die includes identifying the circuitry undergoing the state-changing operation as one containing a suspect circuit path.

4. The method of claim 3, wherein identifying the circuitry path includes determining that the circuit path is more likely to respond to a change in timing margin than another circuit path in the die.

5. The method of claim 1, wherein causing circuitry in the die to undergo a state-changing transition includes causing a source/drain region located in the silicon portion of the SOI structure to change voltage, and wherein detecting a response includes detecting the voltage change.

6. The method of claim 1, wherein providing a die having a thinned backside includes thinning the die backside and exposing at least a portion of the insulator.

7. The method of claim 1, wherein operating circuitry includes operating the die in a loop that is known to cause a failure to occur at a selected rate.

8. The method of claim 1, wherein electrically coupling a capacitance load to underlying circuitry includes using the insulator portion of the SOI as a dielectric and thereby inducing a voltage upon the underlying circuitry.

9. The method of claim 1, wherein detecting a response from the die includes detecting an electrical response from the die via interconnects coupled to the die.

10. The method of claim 9, wherein detecting a response from the die further includes detecting secondary electrons from the die generated in response to the electron beam probe and to the logic state of the underlying circuitry.

11. The method of claim 1, wherein detecting a response from the die includes detecting secondary electrons from the die generated in response to the electron beam probe and to the logic state of the underlying circuitry.

12. The method of claim 1, wherein detecting a response includes obtaining a waveform and correlating the waveform with a circuit path that undergoes a state-changing transition in response to the electron beam probe.

13. The method of claim 1, wherein operating the die near a state-changing transition between a failed mode and a recovered mode includes at least one of: using an advanced timing margin, using a delayed timing margin and varying the timing margin over time.

14. The method of claim 1, further comprising first analyzing a non-defective die in the same manner as the die being analyzed, the non-defective die having the same design as the die being analyzed, and wherein analyzing the die includes comparing the analysis of the non-defective die with the die being analyzed.

15. A system for analyzing a semiconductor die having silicon-on-insulator (SOI) structure and circuitry in a circuit side opposite a back side, the system comprising:

means for operating circuitry in the die near a state-changing transition between a failed mode and a recovered mode;

means for probing a thinned back side of the die to electrically couple a capacitance load to underlying circuitry via the insulator of the SOI structure and thereby altering the timing margin of a portion of the circuitry and causing the portion of the circuitry to undergo a state-changing transition; and means for detecting a response from the die, the response being related to the state-changing transition, and for analyzing the die therefrom.

16. A system for analyzing a semiconductor die having silicon-on-insulator (SOI) structure and circuitry in a circuit side opposite a back side, the system comprising:

a power supply adapted to operate circuitry in the die near a state-changing transition between a failed mode and a recovered mode;

a probe adapted to probe a thinned back side of the die to electrically couple a capacitance load to underlying circuitry via the insulator of the SOI structure and thereby alter the timing margin of a portion of the circuitry and causing the portion of the circuitry to undergo a state-changing transition; and a detector adapted to detect a response from the die, the response being related to the state-changing transition, and to analyze the die therefrom.

17. The system of claim 16, further comprising a substrate removal arrangement adapted to remove substrate from a back side of the semiconductor die and expose the insulator portion of the SOI structure.

18. The system of claim 16, wherein the power supply includes a signal generator adapted to supply signals to the die that exhibit a timing margin that is altered from a design timing margin of the die.

19. The system of claim 16, wherein the detector includes at least one of: a laser probe, a microscope, an electron beam probe and an electronic testing device.

20. The system of claim 16, wherein the detector includes a SEM adapted to scan the die and obtain an image of the die having varied contrast, the variations in contrast being indicative of circuit portions having different voltages.

21. The system of claim 16, wherein the detector is adapted to use the detected response to identify circuit paths within the die that are subject to failure at a greater rate than other circuit paths in the die.

22. The system of claim 16, wherein the probe is adapted to scan across the thinned back side.

\* \* \* \* \*